United States Patent [19]

Sakurai

[11] Patent Number: 4,764,901
[45] Date of Patent: Aug. 16, 1988

[54] SEMICONDUCTOR MEMORY DEVICE CAPABLE OF BEING ACCESSED BEFORE COMPLETION OF DATA OUTPUT

[75] Inventor: Takayasu Sakurai, Tokyo, Japan

[73] Assignee: Kabushiki Kaisha Toshiba, Kawasaki, Japan

[21] Appl. No.: 761,709

[22] Filed: Aug. 2, 1985

[30] Foreign Application Priority Data

Aug. 3, 1984 [JP] Japan .................................. 59-163508
Jun. 19, 1985 [JP] Japan .................................. 60-133420

[51] Int. Cl.$^4$ .......................... G11C 7/00; G11C 8/00
[52] U.S. Cl. .................................. 365/189; 365/203; 365/222; 365/233
[58] Field of Search ................ 365/203, 205, 233, 189, 365/222, 230, 190

[56] References Cited

U.S. PATENT DOCUMENTS

| | | | |
|---|---|---|---|
| 4,085,457 | 4/1978 | Itoh | 365/233 |
| 4,106,109 | 8/1978 | Fassbender | 365/238 |
| 4,131,951 | 12/1978 | Asahi | 365/203 |
| 4,330,852 | 5/1982 | Redwine et al. | 365/205 |
| 4,354,256 | 10/1982 | Miyasaka | 365/189 |
| 4,542,483 | 9/1985 | Procy | 365/203 |
| 4,551,641 | 11/1985 | Pelley | 365/205 |

FOREIGN PATENT DOCUMENTS

56-77982 11/1979 Japan .

OTHER PUBLICATIONS

O. Minato et al., "A 20 ns 64K CMOS SRAM," IEEE International Solid State Circuits Conference, pp. 222–223 and 343, vol. 27, 2-23-84.
J. J. Fallin, "The Chip That Refreshes Itself," Computer Design, pp. 111–122, vol. 22, No. 3, (Mar. 1983).
Kawamoto et al., "A 288Kb CMOS Pseudo SRAM," IEEE International Solid-State Circuits Conference, pp. 276–277, Feb. 24, 1984.

*Primary Examiner*—Stuart N. Hecker
*Assistant Examiner*—Alfonso Garcia
*Attorney, Agent, or Firm*—Finnegan, Henderson, Farabow, Garrett & Dunner

[57] ABSTRACT

The semiconductor memory device contains a plurality of memory cells, a row decoder for selectively actuating memory cells according to the selected one of the row and column address signals, and bit lines set to a potential dependent on the data in the memory cell actuated. Particularly, this memory device has latching circuits for latching the potentials on the bit lines, and a timing controller for causing the latching circuits to keep the latched potentials for a predetermined period after the update of the row address signal.

9 Claims, 8 Drawing Sheets

FIG. 4A
ADDRESS SIG.
T0       T9

FIG. 4E
BA11 AND BB11
T2

FIG. 4K
D1 AND D2

FIG. 4N
BX1 AND BY1

FIG. 4P
DA AND DB

FIG. 4Q
DATA FROM
BUFFER 36
              T8

SEMICONDUCTOR MEMORY DEVICE CAPABLE OF BEING ACCESSED BEFORE COMPLETION OF DATA OUTPUT

BACKGROUND OF THE INVENTION

This invention relates to a semiconductor memory device.

The semiconductor memory device is indispensably used for a main memory of a computer system. In general, the semiconductor memory device is composed of a plurality of memory cells matrix arrayed on a semiconductor chip, and row and column decoders for decoding row and column address signals. The row decoder is connected to work lines laid in rows of a matrix array of the memory cells. The memory cells arrayed in the same row are selected by the row decoder through an associated one of the word lines. Bit lines are laid in the columns of the matrix array to transfer data to and from the memory cells. The column decoder selects the bit lines according to the column address signal. Data to be written is supplied from the data line to one of the bit lines, and data read out from the cells is transferred from one of the bit lines to the data line.

The dynamic RAMs have predominantly been used recently for high density semiconductor memory devices. The memory cell of the dynamic RAM has a relatively simple structure in that there are essential elements, for example, a capacitor and a transfer gate. The current path of the transfer gate is connected between the capacitor and the bit line. The conduction state of the transfer gate is controlled by the row decoder through the associated word line. The memory cell stores binary data "0" or "1" according to the amount of charge an the capacitor. Charge in the capacitor tends to decrease with time due to leakage current in the semiconductor chip. In the dynamic RAM, therefore, the memory cells must be refreshed to maintain their validity before data in the capacitor becomes too volatile due to the current leak.

To refresh the memory cell when data in that memory cell is read out, the same data rewritten into the same memory cell. Specifically, a bit line is precharged to a predetermined potential, e.g., 5V. Then, the transfer gate is turned on, and the potential of the bit line is varied according to the charge amount of the capacitor. A sense amplifier, for example, senses a potential variation of the bit line to determine the contents of the memory cell. The sense amplifier sets the bit line potential to 0V or 5V according to the sensed data, which either charges or discharges the capacitor. Then, the transfer gate is turned off, so that a predetermined amount of charge is held in the capacitor.

In a large dynamic RAM of, for example 256K bits, each capacitor cannot store much charge, because the capacitors are discretely manufactured and minute. Therefore, it is conventional to refresh all of the memory cells of the dynamic RAM cyclically at periods of 4 ms or less. If the refresh cycle has a period of more than 4 ms, the data in the memory cells may be altered into erroneous data with a great possibility.

Usually, in the dynamic RAMs, the refresh operation and the normal operation (i.e., read/write operation) are assigned to independent time bands, and the memory cells are periodically refreshed. In the refresh mode, all of the bit lines are used for refreshing the memory cells in a specific row. For this reason, these bit lines can not be used for the read/write operation. To avoid an erroneous operation, access to the dynamic RAM is prohibited during the refresh operation. This is one of the major factors which reduces the effective access speed of the dynamic RAM.

In designing the computer system using the dynamic RAM, a designer always allows for the refresh timings of the dynamic RAM. This greatly increases the designer's task.

This problem also affects the layout and the connection of the components. Switching circuits whose conductive states are controlled by the column decoder are provided in the vicinity of the ends of the bit lines. The data line is connected through these switching circuits to the bit lines. This causes each of, the bit lines to have a relatively large stray capacitance. For example, if in a read mode one of the switching circuits is made conductive, the potential on the precharged data line varies with that on the associated bit line. If the stray capacitance is large, a great deal of time is taken for setting up the data line to a predetermined potential. Therefore, use of the bit lines for the next memory access is prohibited until that potential variation terminates. Thus, the time delay by the data line restricts the speed of the dynamic RAM operation.

SUMMARY OF THE INVENTION

Accordingly, an object of the present invention is to provide a semiconductor memory device with a short access time.

To achieve the above object, there is provided a semiconductor memory device receiving address signals and comprising a plurality of memory cells for storing data; selecting means for accessing a selected one of the plurality of memory cells identified by the address signals; sensing means, coupled to the memory cells, for sensing the data stored in the selected memory cell to generate and transfer an output signal representing the stored data in the selected memory cell; latching means, coupled to the sensing means, for latching the output signal transferred from the sensing means; output means, coupled to the latching means, for generating output data in response to the latched output signal; and transfer control means, coupled to the sensing means and to the latching means, for temporarily preventing the transfer of the output signal from the sensing means to the latching means after the latching means has latched the output signal; whereby the sensing means is permitted to sense data from another one of the plurality of memory cells while the output circuit generates the output data from said latched output signal.

Particularly in the case of the dynamic memory circuits, this invention reduces the access time remarkably.

BRIEF DESCRIPTION OF THE DRAWINGS

FIGS. 4A to 4N, 4P and 4Q show a set of waveforms for explaining the operation of the FIG. 1 memory device;

DETAILED DESCRIPTION OF THE PREFERRED EMBODIMENTS

Figure 1:
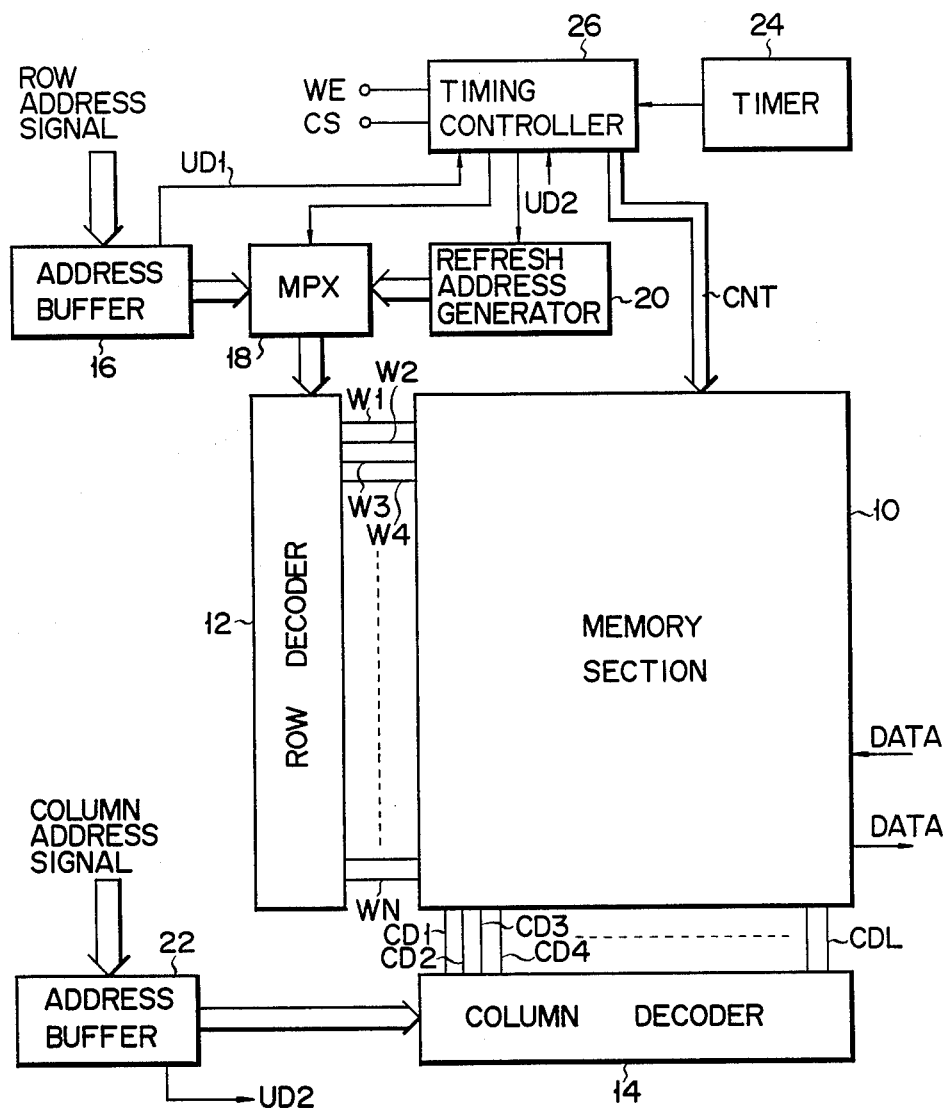
FIG. 1 is a block diagram of an embodiment of a semiconductor memory device according to this invention.
Figure 2:
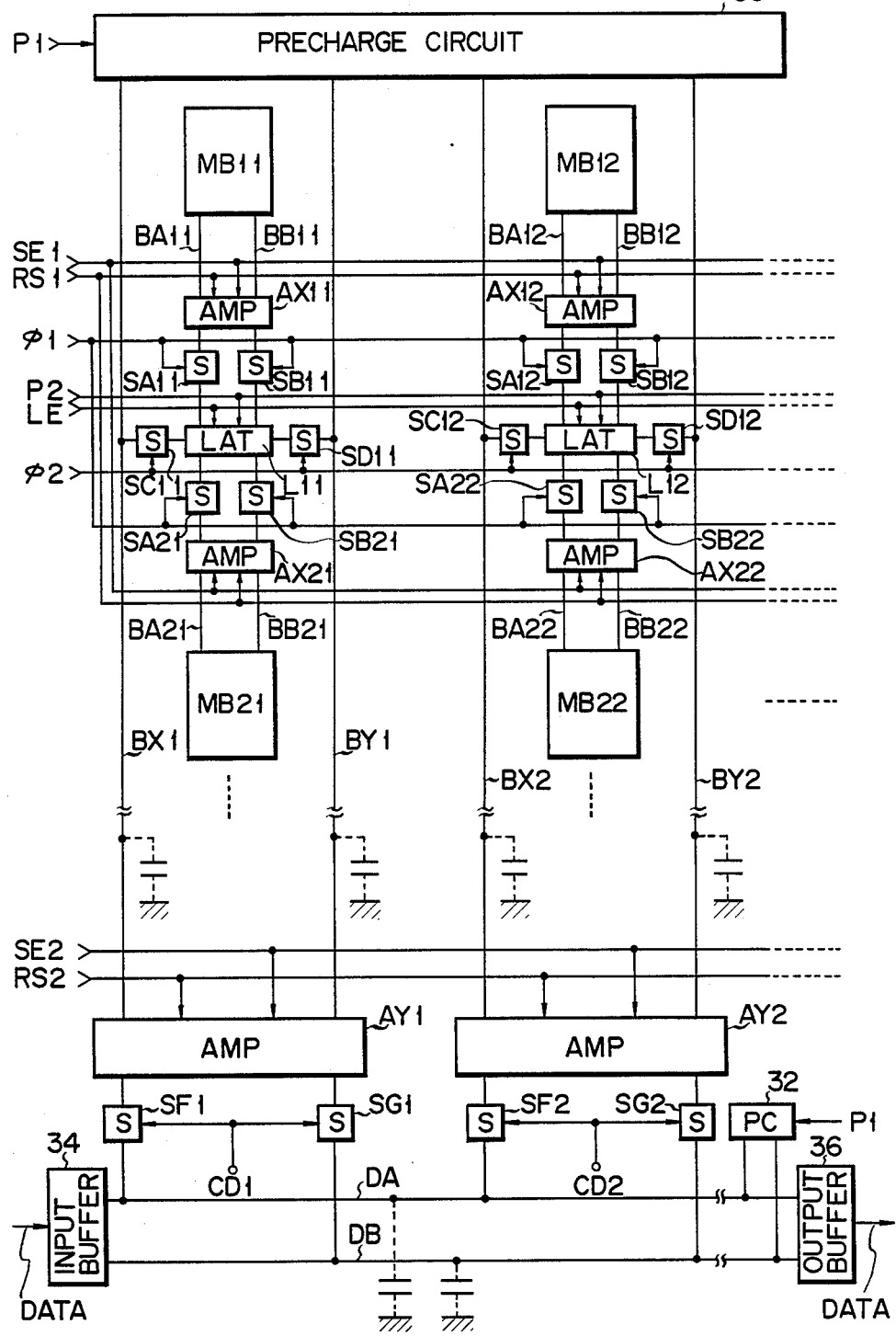
FIG. 2 is a circuit diagram of a memory section 10 used in the circuit of FIG. 1.
Figure 3:
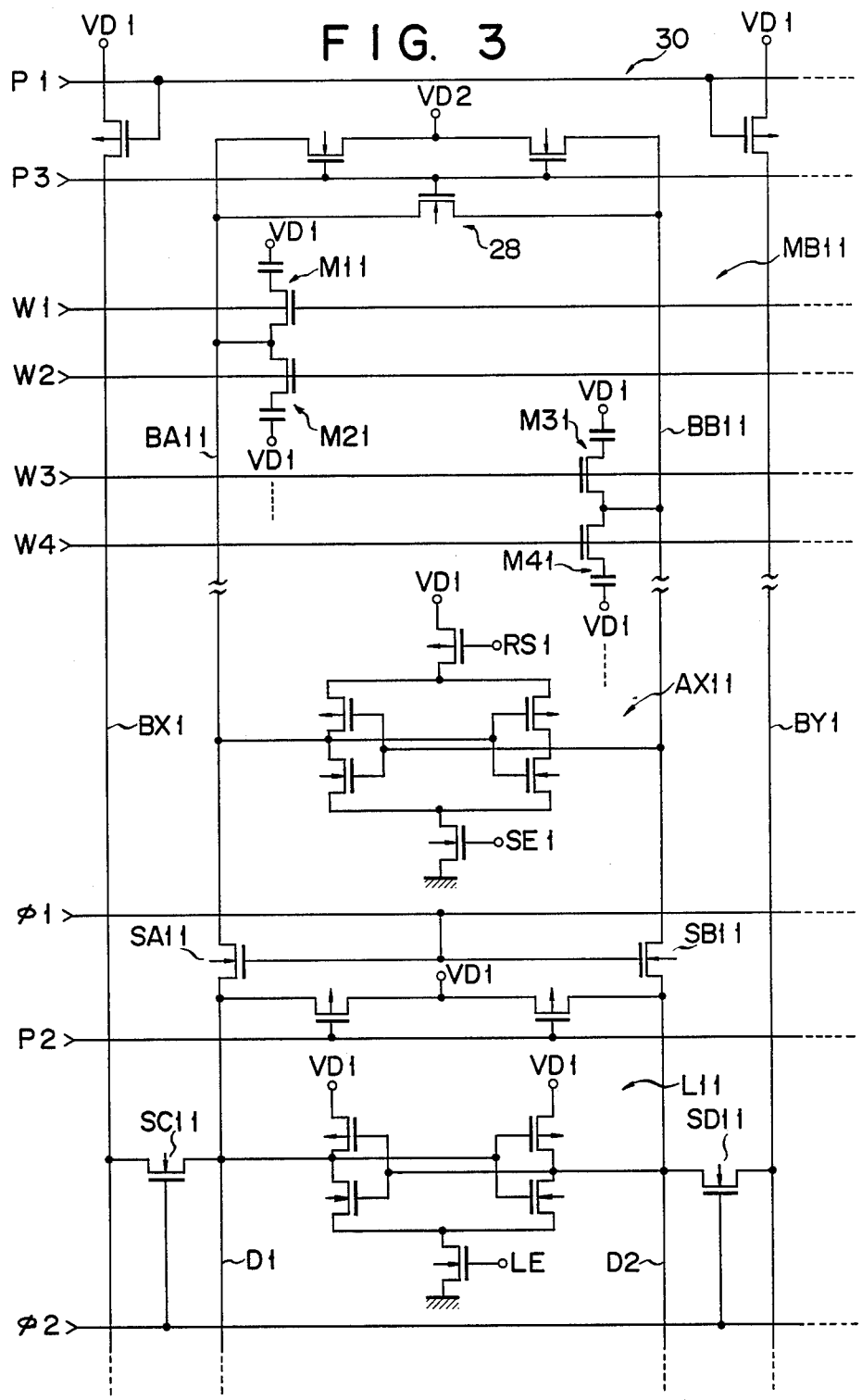
FIG. 3 is a circuit diagram of a circuit for making an access to a memory block M11 in the circuit of FIG. 2.

Referring to FIGS. 1 to 3 show a semiconductor memory device according to an embodiment of this invention. FIG. 1 shows a semiconductor memory device which comprises a memory section 10, a row decoder 12, and a column decoder 14. The memory section 10 includes an N×L matrix of memory cells (not shown in FIGS. 1 and 2) arrayed on a semiconductor chip. Each memory cell is a dynamic type one bit memory made up of one capacitor and one transfer gate, for example.

A row address signal is supplied to an address buffer 16. The address buffer 16 latches the row address signal and then supplies the latched address signal to a multiplexer 18. The address buffer 16 also contains a transition detector (not shown) which generates a detection signal UD1 in response to the update of the row address signal. The multiplexer 18 further receives a refresh address signal from a refresh address generator 20.

The row address signal or the refresh address signal is selectively supplied to a row decoder 12. The row decoder 12 actuates the memory cells in a row of the memory matrix in the memory section 10, which is specified by the received address signal. Specifically, the output terminals of the row decoder 12 are respectively connected to word lines W1 to WN laid in the rows of the memory matrix. The row decoder specifies one of the word lines and supplies a select signal to the corresponding memory cells through the specified word line.

A column address signal is supplied to an address buffer 22. The address buffer 22 latches the column address signal and supplies the latched address signal to a column decoder 14. The address buffer 22 has a transition detector (not shown) which produces a detection signal UD2 in response to the update of the column address signal. The column decoder 14 supplies a select signal to one of the control lines CD1 to CDL to specify the column of the memory cells to be selected by the received signal.

A timer 24 shown in FIG. 1 periodically supplies a refresh request to a timing controller 26 to refresh the memory cells before the data stored therein becomes too volatile. The timing controller 26 is provided for controlling the address buffer 16, the refresh address generator 20 and the memory section 10. To this end, the timing controller 26 is connected for reception to a write enable signal WE, a chip select signal CS and a refresh request, and generates various types of control signals at predetermined timings, as will be given later. The chip select signal CS is supplied to the timing controller 26 to permit the memory access. The write enable signal WE is supplied to the timing controller 26 to specify one of the write and read modes.

Upon receipt of the refresh request, the timing controller 26 generates N update requests of the refresh address in synchronism with the updates of the row address signal. The first update request is used as a reset signal of the refresh address generator 20. The timing controller 26, referring to the detection signals from the address buffers 16 and 22, maintains the update timings of the address signal and the refresh address signal in a predetermined time difference.

The refresh address generator 20 responds to the respective update requests coming from the timing controller 26, and changes the refresh address from a predetermined one to the succeeding one in order to specify the memory cells in all the rows of the memory matrix. The timing controller 26, in updating the refresh address, controls the multiplexer 18 to supply the output signal of the refresh address generator 20 to the row decoder 12. In updating the row and column address signals, the timing controller 26 controls the multiplexer 18 to supply the output signal of the address buffer 16 to the row decoder 12.

A circuit arrangement of the memory section 10 of FIG. 1 is illustrated in FIG. 2. FIG. 3 illustrates in detail a circuit to make an access to a memory block MB11 shown in FIG. 2. As shown in FIG. 2, the memory section 10 includes memory blocks MB11, MB21, . . . , MB12, MB22, . . . For example, the memory cells in the first column form memory blocks MB11, MB21, . . . In FIG. 2, word lines W1 to WN are omitted. In FIG. 3, some of the word lines W1 to WN, that is, word lines W1 to W4, are illustrated in association with a word memory block MB11. Bit lines BA11, BA12, . . . shown in FIG. 2 are paired with bit lines BB11, BB12, . . . , respectively. The bit lines BA11, BB11 are laid along the memory cells of the memory block MB11. The bit lines BA21 and BB21 are laid along the memory cells of the memory block 21. The bit lines BA12 and BB12 extend along the memory cells of the memory block MB12. The bit lines BA22 and BB22 extend along the memory cells of the memory block MB22.

In a similar way, a pair of bit lines are provided for each of the remaining memory blocks. Memory blocks MB11, MB12, . . . , and MB21, MB22, . . . include precharge circuits similar to in construction. A precharge circuit 28 shown in FIG. 3 includes three MOS transistors. Upon receipt of a control signal P3 from the timing controller 26, the precharge circuit 28 sets the potential on bit lines BA11 and BB11 to a predetermined level, i.e., ½ of the power source potential VDD. The data terminals of the memory cells M11, M21, . . . in the memory block MB11 are connected to one of the paired bit lines BA11 and BB11. The data terminals of the adjacent memory cells, for example, M11 and M21, are connected together to the bit line BA11. The memory cells M31 and M41 are connected together to the bit line BB11.

As shown in FIG. 2, this memory device contains sense amplifiers AX11, AX21, . . . , AX12, AX22, . . . in association with the memory blocks MB11, MB21, . . . , and MB12, MB22, . . . The sense amplifiers AX11, AX12 . . . , AX21, AX22, . . . respond to the control signals SE1 and RS1 supplied from the timing controller 26. For example, the sense amplifier AX11 is made up of six MOS transistors, as shown in FIG. 3. In response to the control signal SE1, the sense amplifier AX11 sets the potential of one of the bit lines BA11 and BB11 to the ground level, e.g., 0V, while in response to the control signal RS1, it sets the other to VDD level, e.g., 5V. For example, when the potential on the bit line BA11 is lower than that on the bit line BB11, the sense amplifier AS11 sets the bit line BA11 to the ground level, and sets the potential on the bit line BB11 to the VDD level. The remaining sense amplifiers operate in a similar way to the sense amplifier AX11.

This memory device also includes switching circuits SA11, SA21, ..., SA12, SA22, ... associated with the bit lines BA11, BA21, ..., BA12, BA22, ... For example, the switching circuits SA11 and SB11 are respectively constructed with transfer gates, as shown in FIG. 3, and are conductive by a control signal $\phi 1$ from the timing controller 26.

The memory device further includes a latching circuit L11 associated with the memory blocks MB11 and MB21, and a latching circuit L12 associated with the memory blocks MB12 and MB22. In the same column, a single latching circuit is provided for the adjacent memory blocks, as in the above case. For example, the latching circuit L11, as shown in FIG. 3, includes two MOS transistors to precharge lines D1 and D2 to the VDD level in response to a control signal P2, and further includes five MOS transistors for latching the potentials on the lines D1 and D2 in response to a control signal LE from the timing controller 26. The lines D1 are connected to the bit line BA11 through the switching circuit SA11, and connected to the bit line BA21 through the switching circuit SA21. The line D2 is connected through the switching circuit SB11 to the bit line BB11, and to the bit line BB21 via the switching circuit SB21. The remaining latching circuits are constructed like the latching circuit L11.

Bit lines BX1 and BY1 shown in FIG. 2 are provided in association with the memory blocks MB11, MB21, ..., while bit lines BX2 and BY2 are provided in association with the memory blocks MB12, MB22, ... The other memory blocks in the columns (not shown) are each coupled with a pair of bit lines. Of the latching circuits in the same column, for example, the latching circuit L11 is connected via the switching circuits SC11 and SD11 to the bit lines BX1 and BY1. The switching circuits SC11 and SD11 are constructed with transfer gates, as shown in FIG. 3, and are conductive in response to a control signal $\phi 2$ derived from the timing controller 26.

This memory device, as shown in FIG. 2, includes a precharge circuit 30 and sense amplifiers AY1, AY2, ... The precharge circuit 30 responds to a control signal P1 from the timing controller 26 to precharge the bit lines BX1, BY1, ..., and BY1, BY2, ... to the VDD level. The sense amplifiers AY1, AY2, ... are provided in association with the paired bit lines BX1 and BY1, and BX2 and BY2, ...

The sense amplifiers AY1, AY2, ... are constructed in the same manner as the sense amplifiers AX11, AX12, ..., and respond to control signals SE2 and RS2 from the timing controller 26. The bit lines BX1, BX2, ... are connected through switching circuits SF1, SF2, ... to a data line DA. The bit lines BY1, BY2, ... are connected through switching circuits SG1, SG2, ... to a data line DB. The switching circuits SF1 and SG1 respond to a select signal derived from the column decoder 14 through the control line CD1, and are made conductive. The switching circuits SF2, SG2, are supplied with a select signal from the column decoder through the control line CD2, and are made conductive by this select signal. The precharge circuit 32 shown in FIG. 2 responds to a control signal P1 from the timing controller 26, and sets the potential on the data lines DA and DB to the VDD level. An input buffer 34 latches therein write data and sets one of the precharged data lines DA and DB to the ground level. An output buffer 36 latches therein, as read data, the data dependent on a potential difference between the data lines DA and DB.

The operation of the semiconductor memory device will be described referring to FIGS. 4A to 4N, 4P and 4Q. The timing controller 26 receives a chip select signal CS. For example, a read out mode is set up by supplying no write enable signal. In this read out mode, as shown in FIG. 4A, when the row and column address signals are updated at time T0, the transition detectors of the address buffers 16 and 22 generate detection signals UD1 and UD2, respectively. In response to these signals UD1 and UD2, the timing controller 26 generate control signals P1 to P3, as shown in FIGS. 4B to 4D. At time T2, the potentials on all of the bit lines BA11, BA12, ..., BA21, BA22, ... are precharged to $\frac{1}{2}$ the VDD level. FIG. 4E shows potentials on the bit lines BA11 and BB11. The potentials on the bit lines BX1, BX2, ..., BY1, BY2, ..., lines D1 D2, ..., and data lines DA and DB are precharged to the VDD level.

The timing controller 26 directs the multiplexer 18 to supply a row address signal to the row decoder 12 at time T1. If the row and the column address signals specify the memory cell M11, the row decoder 12 supplies a select signal to the word line W1 at time T3, as shown in FIG. 4F. When the transfer gate of the memory cell M11 is made conductive by the select signal, the potential on the bit line BA11 changes according to a charge amount of the capacitor of the memory cell M11. If the charge of the capacitor is zero, the potential on the bit line BA11 drops as indicated by a solid line in FIG. 4E because of the charging of the capacitor. At this time, the potential on the bit line BB11 remains unchanged, as indicated by a dotted line.

The timing controller 26 produces a control signal SE1 at time T4, as shown in FIG. 4G when the potential on the bit line BA11 changes to such a degree as the sense amplifier AX11 can sense its change, and produces a control signal RS1 at time T5, as shown in FIG. 4H. In response to the control signals SE1 and RS1, the sense amplifier AX11 sets the potential on the bit line BA11 to the ground level, as shown by a solid line in FIG. 4E, and sets the potential on the bit line BB11 to the VDD level, as shown by a broken line in FIG. 4E. Afterwards, the timing controller 26 generates a control signal $\phi 1$ shown in FIG. 4I to turn on the switching circuits SA11 and SB11. The potentials on the lines D1 and D2 change according to the potentials on the bit lines BA11 and BB11, as shown in FIG. 4K.

The timing controller 26 generates a control signal LE at time T6, as shown in FIG. 4J during which the switching circuits SA11 and SB11 are conductive. The latching circuit L11 responds to the control signal LE and makes the potential on the lines D1 and D2 equal to that on the bit lines BA11 and BB11. The timing controller 26 stops the generation of the control signal $\phi 1$ at time T7. As a result, the switching circuit SA11 electrically disconnects the bit line BA11 from the line D1, and the switching circuit SB11 disconnects the bit line BB11 from the line D2. Therefore, the potential on the lines D1 and D2 is kept independent of the potentials on the bit lines BA11 and BB11.

When the timing controller 26 generates a control signal $\phi 2$ at time T7, as shown in FIG. 4L, the switching circuits SC11 and SD11 are turned on. The potentials on the bit lines BX1 and BY1 vary with these on the lines D1 and D2. Then, the timing controller 26 generates control signals SE2 and RS2. The sense amplifier AY1 senses a potential difference between the bit lines BX1 and BY1, the potential on the bit lines BX1 and BY1 are respectively set to the ground level and the VDD level, as shown by solid and broken lines in FIG. 4N. The switching circuits SF1 and SG1 are made conductive for a predetermined period by a select signal from the column decoder 14. The result is that the potentials on the data lines DA and DB vary with those on the bit lines BX1 and BY1, as shown by solid and broken lines in FIG. 4P. At time T8 when the potential difference between the data lines DA and DB reaches a predetermined value, the output buffer 36 latches data dependent on the potential difference, as the read out data, as shown in FIG. 4Q.

Let us consider a case where the timing controller 26 receives a refresh request from the timer 24 before the generation of the control signal $\phi 1$ is stopped at time T7. The timing controller 26 causes the refresh address generator 20 to generate a refresh address signal after time T7. Also at this time, the same causes the multiplexer 18 to supply to the row decoder 12 the refresh address signal generated by the generator 20 at time T9 as indicated by a broken line in FIG. 4A. The timing controller 26 generates a control signal P3 at time T10, as shown in FIG. 4D. As a result, the bit lines BA11, BA21, . . . ; BA12, BA22, . . . and the bit lines BB11, BB21, . . . ; BB12, BB22, . . . are precharged. If the refresh address signal specifies the memory cells in the third row, for example, the memory cell M31, the row decoder 12 supplies a select signal to the word line W3 at time T11, as shown in FIG. 4M. With the supply of the select signal, the potentials on the paired bit lines BA11, BB11; BA12, BB12; . . . vary according to the charge amount in the capacitors of the actuated memory cells. Then, the timing controller 26 generates control signals SE1 and RS1 shown in FIGS. 4G and 4H, the sense amplifiers AX11, AX12, . . . each set one of the paired bit lines BA11, BB11; BA12, BB12; . . . to the ground level and the other to the VDD level according to potential differences therebetween. The row decoder 12 stops the supply of a select signal to the word line W3 at time T12 in FIG. 4M. The transfer gate in the memory cells in the third row is turned off, so that the refresh operation terminates before time T8.

In the above-mentioned embodiment, the sense amplifier AX11, for example, senses a potential difference between the bit lines BA11 and BB11, and sets the potential of one of the bit lines BA11 and BB11 at the ground level, and the potential of the other at the VDD level. Succeedingly, the switching circuits SA1 and SB11 are turned on and, after a predetermined time, are turned off again. Then, the latch circuit L11 latches the potentials on the bit lines BA11 and BB11 as read out data. The read out data is supplied to the output buffer 36, through the bit lines BX1 and BY1 and the data lines DA and DB, and is further latched in the output buffer 36. After the latching circuit L11 latches the potentials on the bit lines BA11 and BB11, these bit lines are electrically disconnected from the latching circuit L11 by the switching circuits SA11, SB11. Therefore, the potentials on the bit lines BA11 and BB11 may change due to the next memory access operation. The read out data already latched is not altered by the potential change. In other words, during the outputting of the latch data, the next memory access is allowed.

When using this semiconductor memory device for a computer system, a designer can more easily design such a system than when using the conventional dynamic RAM. If the dynamic RAM is used, the designer must always allow for the refresh timing. In contradistinction, if the semiconductor memory device of this embodiment is used, the designer can design the computer system without regard to the refreshing time. The memory device generates an address signal to refresh the dynamic memory cells, and such refreshing of the memory cells is automatically performed synchronously with a or memory read/write access cycle. Therefore, the designer can design the computer system without any regard to the refreshing time since refresh cycles independent of read/write cycles are not required.

This embodiment employs the timer 24 having a preset refresh interval to refresh the memory cells before the stored data becomes too volatile. This timer 24 may be replaced by a leak sensing circuit which contains a capacitor equivalent to that in the memory cell which senses a predetermined change in the charge in this capacitor to produce a refresh request.

Figure 5:
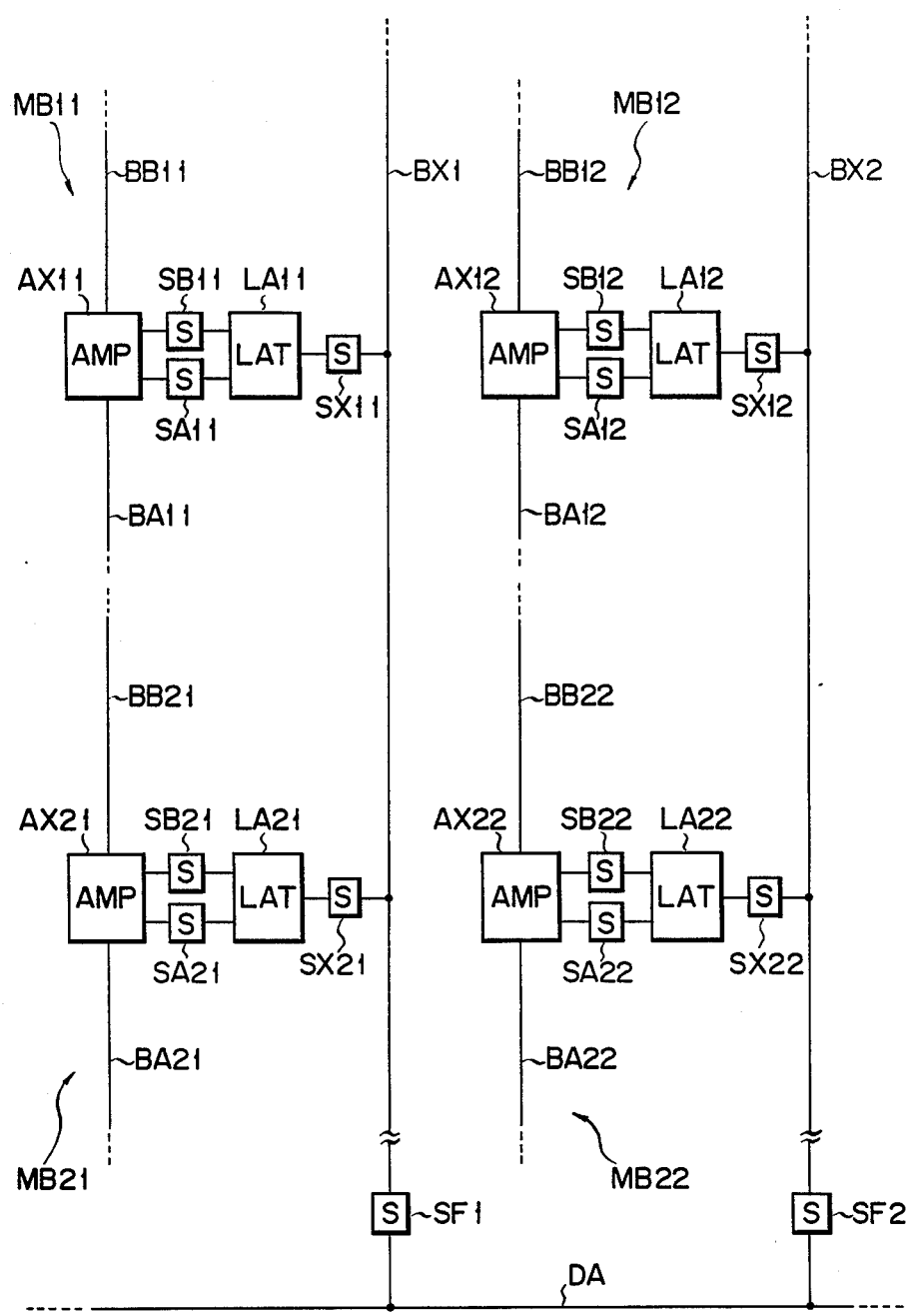
FIG. 5 is a circuit diagram of the memory section 10 when the bit lines of the folded type are replaced by the open type bit lines.

The memory section 10 in this embodiment has a folded bit line structure. Because of this, the bit lines BA11 and BB11 extend in the same direction. The memory section 10 may employ instead an open bit structure if necessary. If such is employed, as shown in FIG. 5, the bit lines BA11 and BB11 extend in the opposite direction on the semiconductor chip. The switching circuits SA11 and SB11 are connected between the sense amplifier AX11 and the latching circuit LA11 shown in FIG. 5 and are made conductive by the control signal $\phi 1$. The latching circuit LA11 latches the first and second output potentials of the sense amplifier AX11, i.e., the potentials on the bit lines BA11, and BB11 when the switching circuits SA11 and SB11 are conductive, and produces an output signal dependent on the potential difference. The switching circuit SX11 responds to a control signal $\phi 2$, and supplies to the bit line BX11 the output signal of the latching circuit LA11.

This memory section shown in FIG. 5 includes circuits similar in construction to the sense amplifier AX11, switching circuits SA11, SB11, SX11, and the latching circuit LA11, with which the circuits are provided in association with the memory blocks MB21, . . . ; MB12, MB22, . . . The memory section shown in FIG. 5 does not need the bit lines BY1, BY2, . . . , the data lines DB and the switching circuits SF1, SF2, . . . connected to these lines.

Figure 6:
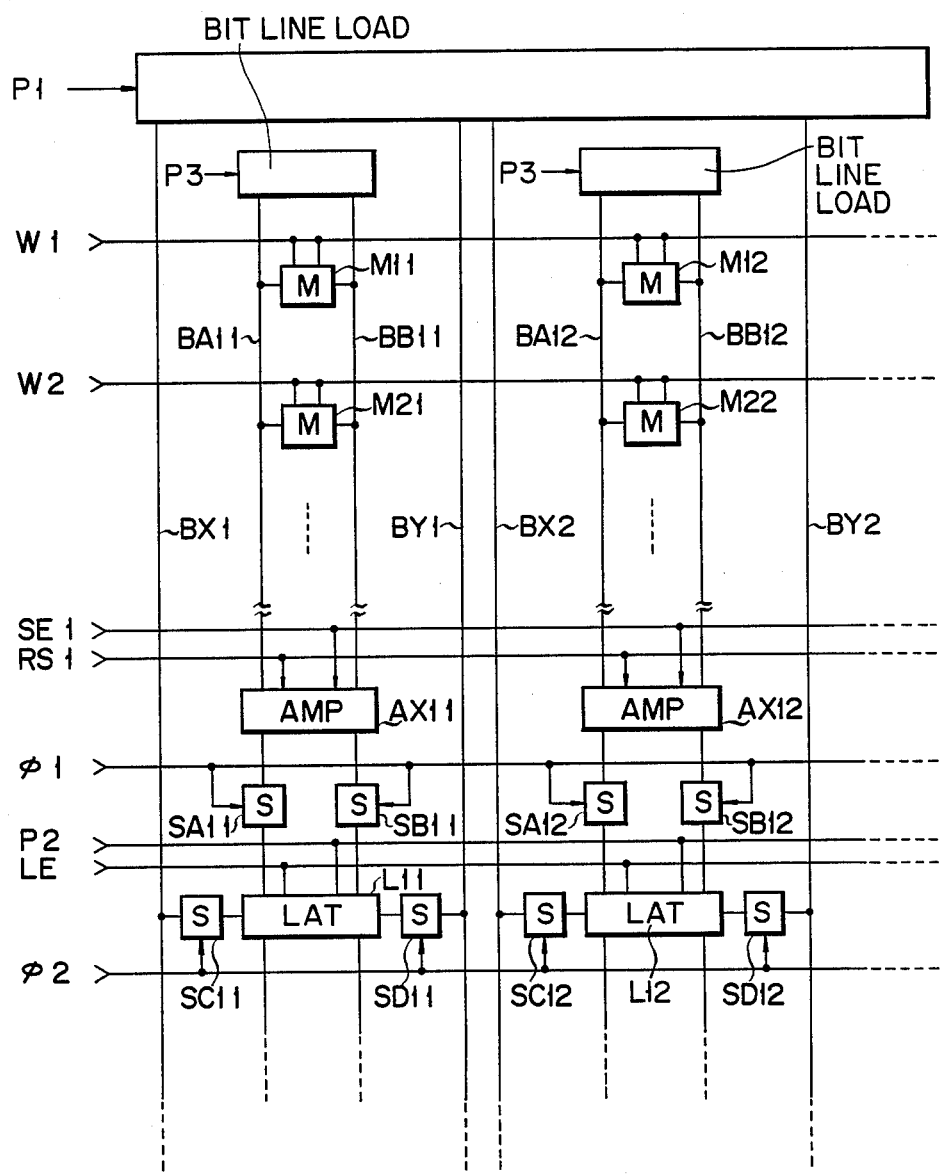
FIG. 6 is a block diagram of another embodiment of a semiconductor memory device according to this invention, this memory device being based on the static memory cells.

In the embodiment described above, the memory cells M11 to MNL are of the dynamic type. If necessary, these memory cells may be of the static type. An example of such a memory device is shown in FIG. 6. In this case, the refresh address generator 20 and the timer 24 are not needed.

Figure 7:
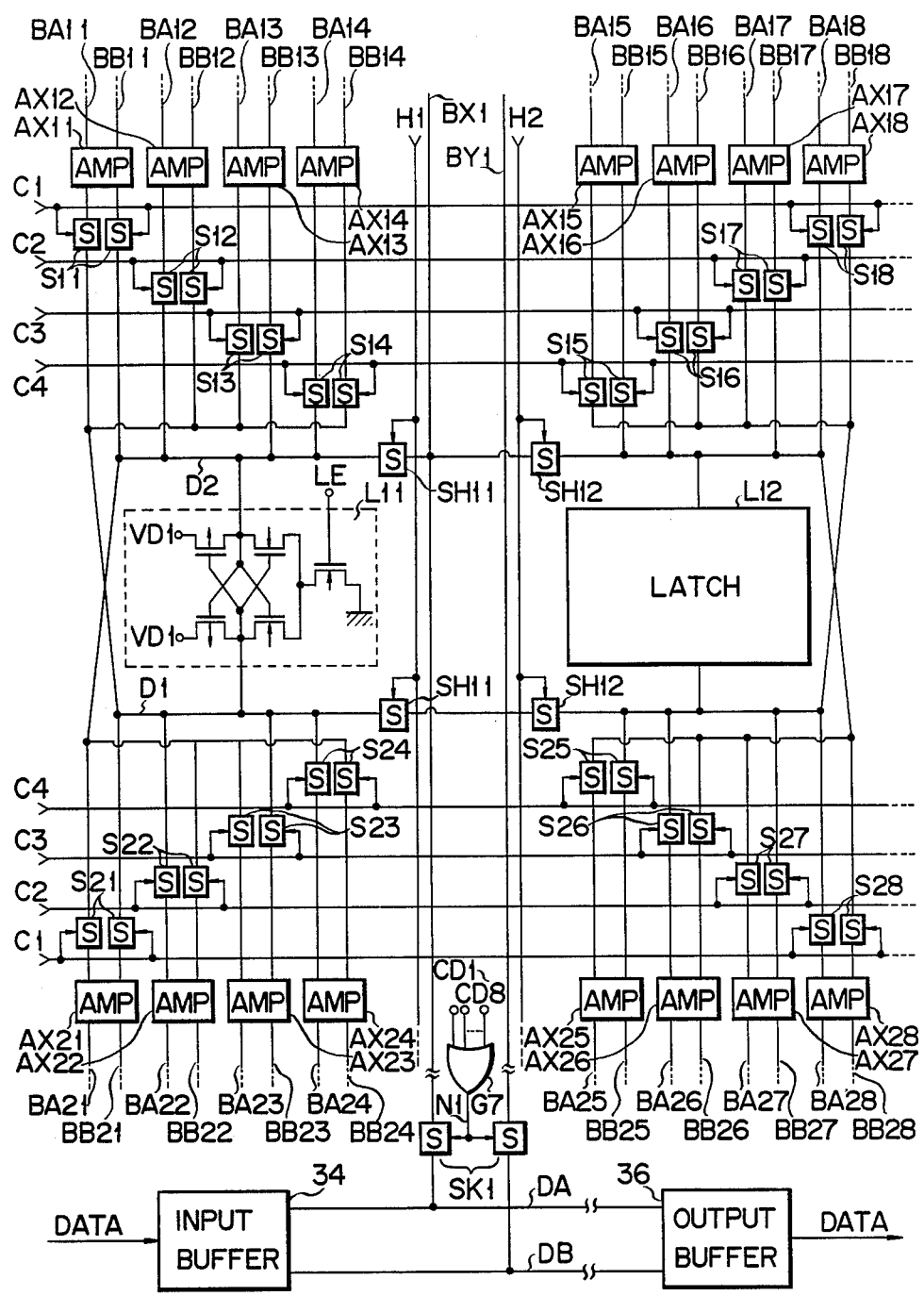
FIG. 7 is a circuit diagram for explaining another embodiment of the memory device which requires fewer latching circuits than the memory section 10 in FIG. 2 does.

The memory section 10 of this embodiment may be modified into a structure as shown in FIG. 7. The sense amplifiers AX11, AX2, . . . , AX21, AX22, . . . are provided in association with the memory blocks MB11, MB21, . . . , MB21, MB22, . . . , as in the previous embodiment. In the memory section of FIG. 7, latching circuits L11, L12, . . . selectively latch the output potential of one of the eight sense amplifiers. The sense amplifier AX11 to AX14 and AY21 to AX24 are connected through switching circuits S11 to S14 and S21 to S24 to the latching circuit L11. The latching circuit L11 is connected to the bit lines BX1 and BY1 by way of the switching circuit SH11.

The sense amplifiers AX15 to AX18 and AX25 to AX28 are connected to the latching circuit L12 by way of the switching circuits S15 to S18 and S25 to S28. The latching circuit L12 is connected to the bit lines BX1, BY1 by way of the switching circuit SH12.

The conduction states of the switching circuits S11, S18, S21 and S28 are controlled by the control signal C1. The conduction states of the switching circuits S12, S17, S22 and S27 are controlled by the control signal C2. The conduction states of the switching circuits S13, S16, S23, and S26 are controlled by the control signal C3. The conduction states of the switching circuits S14, S15, S24, and S25 are controlled by a control signal C4. The control signals C1 to C4 are produced according to the select signals from the row and the column decoders 12 and 14, and the control signal $\phi 1$ from the timing controller 26.

Figure 8:
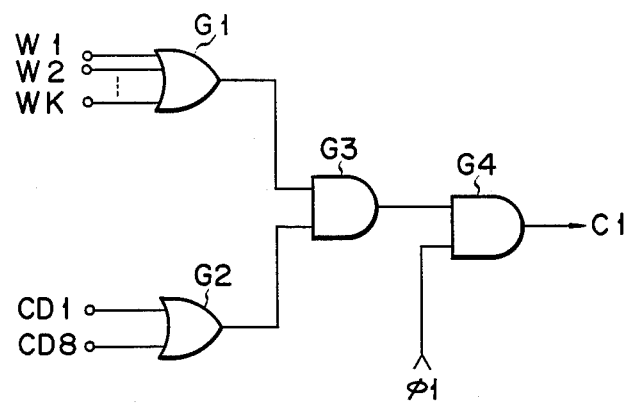
FIG. 8 shows a circuit diagram of a control signal C1 generating circuit used in the circuit of FIG. 7.

Circuits for generating the control signals C1 to C4 each include, for example, two OR gates and two AND gates. FIG. 8 shows a circuit for generating the control signal C1. As shown, the generator circuit includes OR gates G1 and G2 and AND gates G3 and G4. For example when the memory blocks MB11, MB12, . . . , MB21, MB22, . . . each have k rows. Input terminals of the OR gate G1 are connected to the k word lines W1 to WK to receive a select signal from the row decoder 12. Input terminals of the OR gate G2 are connected to the control lines CD1 and CD8 to receive a select signal from the column decoder 14. The AND gate G3 receives the output signals of the gates G1 and G2. The AND gate G4 responds to the control signal $\phi 1$ and supplies the output signal of the AND gate G3, as the control signal C1, to the switching circuits S11, S18, S21 and S28. This control signal C1 turns on the switching circuits S11, S18, S21 and S28.

The circuit arrangement of each of the other control signals C2 to C4 is the same as that of the C1 generating circuit, except for the connections of the input terminals of the OR gate G2. As for the control signal C2, the OR gate receives a select signal from the column decoder 14 through one of the control lines CD2 and CD7 corresponding to the columns of the switching circuits S12, S22, S17 and S27.

The conduction states of the switching circuits SH11, SH12 are controlled by the control signals H1, H2, . . . The control signals H1, H2, are produced according to the select signal from the column decoder 14 and the control signal $\phi 2$ from the timing controller 26. For example, the H1 generating circuit includes an OR gate G5 and an AND gate G6. The OR gate G5 receives a select signal from the column decoder 14 through one of the control lines CD1 to CD4 in the columns of the memory blocks MB11–MB14 and MB21–MB24. The AND gate G6 responds to the control signal $\phi 2$ from the timing controller 26, and supplies the output signal of the OR gate G5 as the control signal H1 to the switching circuits SH11, . . . The control signal H1 turns on the switching circuit SH11.

The circuit arrangements of the circuits for generating the control signals H2, . . . are each the same as that of the H1 signal generating circuit as mentioned above, except the connections of the input terminals of the OR gate G5. As for the control signal H2, the OR gate receives a select signal from the column decoder 14 through one of the control lines CD5 to CD8 in the columns of the memory blocks MB15 to MB18, and MB25 to MB28.

Bit lines BX1, BY1, . . . are connected to the data lines DA and DB, by way of the switching circuits SK1, . . . , respectively. The conduction states of the switching circuits SK1, . . . are controlled by control signals N1, . . . The control signal N1, for example, is generated by the OR gate G7 in FIG. 7. The OR gate G7 receives a select signal from the column decoder 14 through one of the control lines CD1 to CD8 in the column of the memory blocks MB11 to MB18, and MB21 to MB28.

Figure 9:
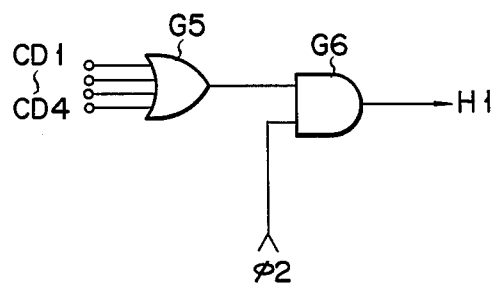
FIG. 9 is a circuit diagram of a control signal H1 generating circuit used in the FIG. 7 circuit.

The semiconductor memory device with the memory section as shown in FIGS. 7 to 9 does not need many latching circuits, unlike the memory section of FIG. 2. Therefore, memory access time is further reduced.

Let us consider a chip area occupied by the semiconductor memory device according to this invention. If a single latching circuit is used commonly for the memory blocks in four columns, the area required for forming the latching circuits is $\frac{1}{4}$ of that of the memory section 10 of FIG. 2. In this case, if the pattern of the latching circuit is expanded 4 times in the row direction, but reduced to $\frac{1}{4}$ in the column direction, the chip length can be reduced.

If a single latching circuit is used for the memory blocks in the eight columns, the chip area required for the latching circuits is reduced to $\frac{1}{8}$ of that of the memory section 10 of FIG. 2. In the memory section 10 of FIG. 2, if the chip area for the latching circuit formation is approximately 10% of the entire area of the semiconductor chip, this approach reduces the entire chip area to approximately $10\% \times \frac{1}{8}$.

The memory device of this embodiment does not need pairs of bit lines BX1, BY1; . . . whose number is equal to that of the columns of the memory blocks. For example, when the memory section has memory blocks of 512 columns, the memory section 10 of FIG. 2 needs 512 pairs of the bit lines BX1, BY1, . . . In this embodiment, however, only 64 pairs of bit lines BX1, BY1; . . . are required. In the case where the distance between the bit lines BX1 and BY1 is 7 $\mu$m, the embodiment of FIG. 2 requires a chip width of 6 mm. While, this embodiment requires a width of about 2.9 mm. That is, the chip width for the device is greatly reduced in this embodiment.

What is claimed is:
1. A semiconductor memory device receiving address signals and comprising:
 a plurality of memory cells for storing data;
 selecting means for accessing a selected one of said plurality of memory cells identified by said address signals;
 sensing means, coupled to said memory cells, for sensing the data stored in said selected memory cell to generate and transfer an output signal representing said stored data in said selected memory cell;
 latching means, coupled to said sensing means, for latching said output signal transferred from said sensing means;
 output means, coupled to said latching means, for generating output data in response to said latched output signal; and
 transfer control means, coupled to said sensing means and to said latching means, for temporarily preventing the transfer of said output signal from said sensing means to said latching means after said latching means has latched said output signal, and for permitting said sensing means to sense data from another one of said plurality of memory cells while said output circuit generates said output data from said latched output signal.

2. A semiconductor memory device according to claim 1 wherein said plurality of memory cells are dynamic memory cells.

3. A semiconductor memory device according to claim 2 wherein said selecting means includes buffer means for receiving a first one of said address signals, refresh means, responsive to a change in said first one of said address signals, for generating a refresh address signal as a second one of said address signals, multiplex means, coupled to said buffer means and to said refresh means, for successively supplying said first and said second ones of said address signals in a predetermined timing relationship, and decoding means, coupled to said multiplexing means, for decoding said first and second ones of said address signals to access said selected memory cell.

4. A semiconductor memory device according to claim 3 further comprising bit line means, coupled between said plurality of memory cells and said sensing means, for maintaining a potential representing said data stored in said selected memory cell, and precharge means, coupled to said bit line means and said refresh means, for setting said bit line means at a predetermined level in response to a change of said first address signal; and wherein said sensing means includes sense amplifying means for amplifying the potential on said bit line means representing said stored data.

5. A semiconductor memory device according to claim 4 wherein said transfer control means includes switching means, coupled between said sense amplifying means and said latching means, and controller means for generating timing and control signals to keep said switching means nonconductive while said precharge means is setting said bit line means to said predetermined potential.

6. The semiconductor memory device of claim 5 wherein said bit line means includes first and second bit lines arranged in a folded bit line architecture, and wherein each of said plurality of memory cells is connected to said sense amplifying means by one of said first and second bit lines.

7. The semiconductor memory device of claim 6 wherein said sense amplifying means includes a sense amplifier coupled to said first and second bit lines.

8. A semiconductor memory device receiving address signals and comprising:

a plurality of memory cells for storing data, said plurality of memory cells being arranged in a plurality of blocks of memory cells;

selecting means for accessing selected ones of said plurality of memory cells identified by said address signals;

a plurality of sense amplifiers, each corresponding to a different one of said memory blocks, for sensing the data stored in said selected memory cells to generate and transfer output signals representing said stored data in said selected memory cells;

a plurality of sets of latch circuits, each being coupled to a different one of said sense amplifiers, for latching said output signals transferred from said sense amplifiers;

output means, coupled to said sets of latch circuits, for generating output data in response to said latched output signals; and transfer control means, coupled to said sense amplifiers and to said latch circuits, for temporarily preventing the transfer of said output signals from said sense amplifiers to said latch circuits after said latch circuits have latched said output signals, and for permitting said sensing means to sense data from another one of said plurality of memory cells while said output circuit generates said output data from said latched output signals.

9. A semiconductor memory device receiving address signals and comprising:

a plurality of memory cells for storing data, said plurality of memory cells being arranged in a plurality of blocks of memory cells;

selecting means for accessing selected ones of said plurality of memory cells identified by said address signals;

a plurality of sense amplifiers, each corresponding to a different one of said memory blocks, for sensing the data stored in said selected memory cells to generate and transfer output signals representing said stored data in said selected memory cells;

a latch circuit, coupled to said sense amplifiers, for latching said output signals transferred from said sense amplifiers;

output means, coupled to said latch circuit, for generating output data in response to said latched output signals; and transfer control means, coupled to said sense amplifiers and to said latch circuit, for temporarily preventing the transfer of said output signals from said sense amplifiers to said latch circuit after said latch circuit has latched said output signals, and for permitting said sensing means to sense data from another one of said plurality of memory cells while said output circuit generates said output data from said latched output signals.

* * * * *